(12) United States Patent
Kang et al.

(10) Patent No.: US 6,753,682 B2
(45) Date of Patent: Jun. 22, 2004

(54) WEAK-MAGNETIC FIELD SENSOR USING PRINTED CIRCUIT BOARD MANUFACTURING TECHNIQUE AND METHOD OF MANUFACTURING THE SAME

(75) Inventors: Myung-Sam Kang, Daejeon (KR); Kyoung-Won Na, Yongin-si (KR); Sang-On Choi, Suwon-si (KR); Won-Youl Choi, Suwon-si (KR); Jeong-Hwan Lee, Jinhae-si (KR); Keon-Yang Park, Seoul (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 45 days.

(21) Appl. No.: 10/139,356

(22) Filed: May 7, 2002

(65) Prior Publication Data

US 2003/0169037 A1 Sep. 11, 2003

(30) Foreign Application Priority Data

Mar. 9, 2002 (KR) ................................ 10-2002-0012767

(51) Int. Cl.[7] ............................. G01R 33/04; H01F 5/00
(52) U.S. Cl. ........................ 324/253; 324/260; 336/200
(58) Field of Search ............................... 324/244–260, 324/209, 234; 336/200, 232

(56) References Cited

U.S. PATENT DOCUMENTS

| | | | |
|---|---|---|---|
| 3,833,872 A | * | 9/1974 | Marcus et al. ................ 336/83 |
| 5,936,403 A | | 8/1999 | Tamura |
| 5,986,533 A | * | 11/1999 | Person et al. ................ 336/200 |
| 6,270,686 B1 | | 8/2001 | Tamura |
| 6,270,889 B1 | * | 8/2001 | Kataoka et al. ............. 428/352 |
| 6,293,001 B1 | * | 9/2001 | Uriu et al. .................... 29/608 |
| 6,388,551 B2 | * | 5/2002 | Morikawa ................... 336/223 |
| 6,429,763 B1 | * | 8/2002 | Patel et al. ................. 336/200 |

* cited by examiner

*Primary Examiner*—N. Le
*Assistant Examiner*—Reena Aurora
(74) *Attorney, Agent, or Firm*—Morgan, Lewis & Bockius LLP

(57) ABSTRACT

A weak-magnetic field sensor using printed circuit board manufacturing technique which detects the Earth's magnetic field to obtain positional information, and a method of manufacturing the same is disclosed. The sensor comprises a first base board which is formed at its upper and lower surfaces with first driving patterns and first pickup patterns, a pair of first stacked boards which are stacked on upper and lower surfaces of the first base board and which are formed with magnetic layers thereon, and a pair of second stacked boards which are stacked on outer surfaces of the pair of first stacked boards and which are formed with second driving patterns and second pickup patterns electrically connected to the first driving patterns and the first pickup patterns of the first base board to surround magnetic layers. The magnetic layer, the driving patterns and the pickup patterns provided on the first base board are oriented to be perpendicular to those provided under the first base board.

14 Claims, 5 Drawing Sheets

WEAK-MAGNETIC FIELD SENSOR USING PRINTED CIRCUIT BOARD MANUFACTURING TECHNIQUE AND METHOD OF MANUFACTURING THE SAME

BACKGROUND OF THE INVENTION

1. Field of the Invention

The present invention relates to a weak-magnetic field sensor using printed circuit board manufacturing technique and a method of manufacturing the same, and more particularly to a weak-magnetic field sensor using printed circuit board manufacturing technique and a method of manufacturing the same which is adapted to be mounted on a mobile communication terminal to detect the Earth's magnetic field to obtain positional information.

2. Description of the Prior Art

In the recent trend of offering various additional information services in the spread of mobile phones and mobile terminals, a positional information service becomes established as an essential service, and more accurate and convenient services are required hereafter.

To achieve positional information, it is necessary to provide a sensor capable of precisely determining a current position. As such means for providing positional information, a weak-magnetic field sensor which is intended to detect the Earth's magnetic field to obtain positional information has been used. As a component commonly used in such a weak-magnetic field sensor, there is a flux gate sensor.

The flux gate sensor uses highly permeable magnetic strips for its core components. The flux gate sensor is comprised of a primary coil wound around one of the two magnetic cores and a secondary coil wound around the other of the magnetic cores, and is capable of recognizing a current position by detecting a difference between voltage generated from the primary coil and voltage generated from the secondary coil due to variations of magnetic fields of the cores.

Such a conventional flux gate sensor is manufactured in such a way that two cylindrical cores made of highly permeable magnetic material are wound with copper wires in a certain direction. More specifically, a copper wire as a driving coil (a primary coil) is wound around a magnetic core in a certain direction while maintaining constant spacing and pressure. Subsequently, a pickup coil (a secondary coil) is wound around the magnetic core to detect a magnetic field generated from the magnetic core due to the driving coil. As is the case with the winding of the driving coil, a copper wire as the pickup coil is wound at a constant spacing under constant pressure.

As such, such a flux gate, which is fabricated by winding copper wires, is comprised of a driving coil and a pickup coil for detecting a magnetic field generated from the driving coil. The copper coils are wound around the magnetic cores utilizing a wire coil technology well known in the art. At this point, the secondary coil must be wound to be directed in a X-axis direction and a Y-axis direction so as to obtain an accurate measurement of magnetic field. However, although a conventional flux gate sensor must maintain positional accuracy of a wound coil, it is difficult to maintain the positional accuracy. Since the positional accuracy is easily affected by temperature, light or surface material due to such configuration, accuracy of its attributes is deteriorated.

In addition, since the flux gate sensor is fabricated such that a coil is directly wound around a magnetic core, it has a disadvantage in that the coil is frequently cut. Moreover, since the sensor itself becomes large, it is not compatible with the trend toward miniaturization and weight reduction of electric appliances. The enlargement of the sensor requires increased electricity consumption, so that the sensor cannot achieve miniaturization and reduction of electricity consumption of electric appliances.

To overcome disadvantages of such a conventional flux gate sensor, a weak-magnetic field sensor is proposed in U.S. Pat. Nos. 5,936,403 and 6,270,686, which is manufactured in such a way that amorphous boards having circular etched portions are stacked on both upper and lower surfaces of a glass epoxy base having specific conductive patterns to form an amorphous flat board core, and glass epoxy bases etched to form X coils and Y coils are stacked on the amorphous flat board core. However, since the flux gate sensor disclosed in U.S. Pat. Nos. 5,936,403 and 6,270,686 require a process comprising preparing the amorphous flat board core by etching the amorphous boards to have circular etched portions and stacking of amorphous boards while conforming to the circular etched portions, and stacking epoxy base boards having an X coil and an Y coil etched thereon on the amorphous core, its manufacturing process is complicated and high manufacturing cost is incurred due to stacking of many amorphous boards.

SUMMARY OF THE INVENTION

The present invention has been made keeping in mind the above problems occurring in the prior art, and an object of the present invention is to provide a weak-magnetic field sensor using printed circuit board manufacturing technique and a method of manufacturing the same which can detect weak-magnetic fields with precision and provide accurate positional information.

Another object of the present invention is to provide a weak-magnetic field sensor using printed circuit board manufacturing technique and a method of manufacturing the same which is capable of meeting the need for high density mounting required in a field of application such as mobile phones by accomplishing miniaturization, excellent magnetic efficiency and low electric power consumption by an etching technique for a printed circuit board.

A further object of the present invention is to provide a weak-magnetic field sensor using printed circuit board manufacturing technique which is simply constructed, easily manufactured, and reduced in manufacturing cost by simple circuit construction and a method of manufacturing the same.

In order to accomplish the above object, the present invention provides a weak-magnetic field sensor using printed circuit board manufacturing technique comprising: a first base board which is formed at its upper and lower surfaces with first driving patterns and first pickup patterns; a pair of first stacked boards which are stacked on upper and lower surfaces of the first base board and which are formed with magnetic layers thereon; and a pair of second stacked boards which are stacked on outer surfaces of the pair of first stacked boards and which are formed with second driving patterns and second pickup patterns electrically connected to the first driving patterns and the first pickup patterns of the first base board to surround magnetic layers; then magnetic layer, the driving patterns and the pickup patterns provided on the first base board being oriented to be perpendicular to those provided under the first base board.

Furthermore, the present invention provides a method of manufacturing a weak-magnetic field sensor using printed circuit board manufacturing technique, comprising the steps of: providing first driving patterns and second pickup patterns of a X-axis direction on a surface of a first base board, and first driving patterns and second pickup patterns of a Y-axis direction on the other surface of the first base board by drilling, plating, exposing, developing and etching procedures; preparing first stacked boards on both sides of the first base board by carrying out lay-up of first base layers and magnetic layers on the first base board followed by exposing, developing and etching; and providing second driving patterns and second pickup patterns on both of the upper and lower first stacked boards by carrying out lay-up of second base layers and magnetic layers on both of the upper and lower first stacked boards followed by drilling, plating, exposing, developing and etching.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

This invention will be described in further detail by way of example with reference to the accompanying drawings.

Figure 1:
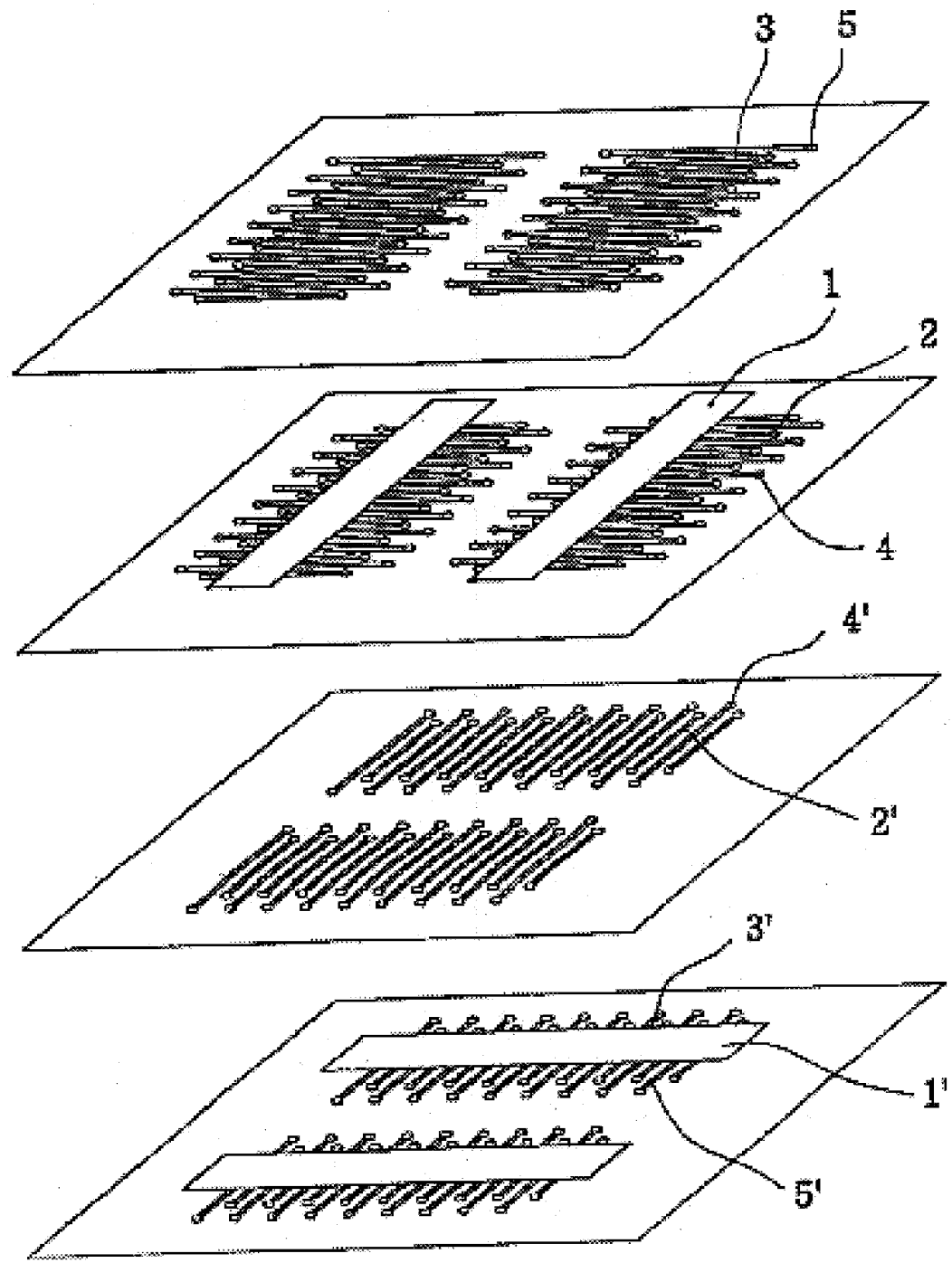
FIG. 1 is an exploded perspective view of an embodiment of a weak-magnetic field sensor using printed circuit board manufacturing technique according to the present invention.
Figure 2:
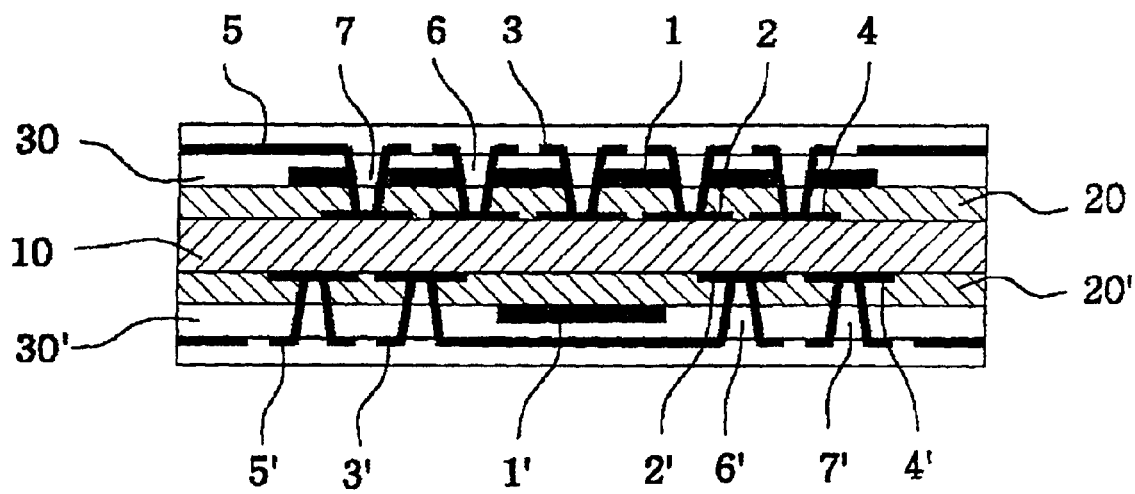
FIG. 2 is a cross-sectional view of the sensor of FIG. 1 in which the boards are stacked.

FIGS. 1 and 2 are an exploded perspective view and a cross-sectional view of an embodiment of a weak-magnetic field sensor using printed circuit board manufacturing technique according to the present-invention.

As shown in the drawings, the weak-magnetic field sensor using printed circuit board manufacturing technique according to the present invention assumes a complex weak-magnetic field sensor including a X-axis weak-magnetic field sensor for detecting weak-magnetic fields with respect to a direction of a X-axis, and a Y-axis weak-magnetic field sensor for detecting weak-magnetic fields with respect to a direction of a Y-axis. As shown in FIG. 1, the X-axis weak-magnetic field sensor unit and the Y-axis weak-magnetic field sensor unit are arranged to be perpendicular to each other.

The weak-magnetic field sensor using printed circuit board manufacturing technique is comprised of a second driving pattern and a pickup pattern (first layer), a magnetic layer (second layer), a first driving pattern (third layer), a first driving pattern (fourth layer), a magnetic layer (fifth layer) and a second driving pattern and a pickup pattern (sixth layer) from top to bottom in this order.

The first through third layers belong to the X-axis sensor unit for detecting weak-magnetic fields with respect to a direction of an axis (X-axis), and the fourth through sixth layers belong to the Y-axis sensor unit for detecting weak-magnetic fields with respect to a direction of the axis perpendicular to the X-axis (Y-axis).

Configurations of the X-axis sensor unit and the Y-axis sensor unit are substantially identical to each other, excepting that one of the sensor units is positioned to be perpendicular to the other.

First, the X-axis sensor unit for detecting weak-magnetic fields with respect to a direction of a X-axis, which is shown at upper portions of FIGS. 1 and 2, will now be described.

Driving patterns and pickup patterns are provided on and under magnetic strips 1. More specifically, under the magnetic strips 1 are disposed driving patterns 2 and pickup patterns 4 which are formed on the same face and alternately arranged with a certain spacing therebetween, and on the magnetic strips 1 are also disposed driving patterns 3 and pickup patterns 5 which are configured to be identical to the upper driving patterns 2 and the upper pickup patterns 4. In this case, the pickup patterns 4 and 5 are sized to be longer than the driving patterns 2 and 3.

The magnetic strips are shaped into band forms. The driving patterns 2 and 3 and the pickup patterns 4 and 5 are arranged on and under the magnetic strips 1 in the same shapes such that the lower and upper driving patterns 2 and 3 surround the magnetic strips 1 and the lower and upper pickup patterns 4 and 5 surround the magnetic strips 1. To electrically connect the upper driving patterns 3 disposed on the magnetic strips 1 and the lower driving patterns 2 disposed under the magnetic strips 1, first via-holes 6 are formed therebetween. Moreover, to electrically connect the upper pickup patterns 5 disposed on the magnetic strips 1 and the lower pickup patterns 4 disposed under the magnetic strips 1, second via-holes 7 are formed therebetween.

The lower and upper driving patterns 2 and 3 are connected to each other in a zigzag manner such that the driving patterns 2 and 3 assume coils wound around the magnetic strips 1, and the lower and upper pickup patterns 4 and 5 are also connected to each other in a zigzag manner such that the pickup patterns 4 and 5 assume coils wound around the magnetic strips 1.

The Y-axis sensor unit for detecting weak-magnetic fields with respect to a direction of a Y-axis, which is shown at lower portions of FIGS. 1 and 2, is configured to be identical to the above-mentioned X-axis sensor unit, excepting that the Y-axis sensor unit is positioned to be perpendicular to the X-axis sensor unit. Accordingly, all of the magnetic strips 1', the driving patterns 2' and 3', and the pickup patterns 4' and 5' belonging to the lower Y-axis sensor unit are oriented to be perpendicular to those of the upper X-axis sensor unit.

When alternating current flows in the driving patterns 2 and 3, density of magnetic flux generated from the magnetic strips 1 varies. Hence, induction current flows in the pickup patterns 4 and 5, thereby generating a voltage difference. By detecting the voltage difference, it is possible to detect weak-magnetic fields in a direction of a X-axis by the upper sensor unit and to detect weak-magnetic field in a direction of a Y-axis by the lower sensor unit simultaneously.

FIGS. 3a to 3i show a process of manufacturing an embodiment of a weak-magnetic field sensor using printed circuit board manufacturing technique according to the present invention.

Figure 3A:
FIGS. 3a to 3h show a process of manufacturing an embodiment of a weak-magnetic field sensor using printed circuit board manufacturing technique according to the present invention.

First, a base board 10 is prepared (FIG. 3a). A CCL (Copper Clad Laminate) is preferably used as the base board 10. At this point, it is preferable to form a reference hole at the base board for convenience in subsequent procedures.

Figure 3B:
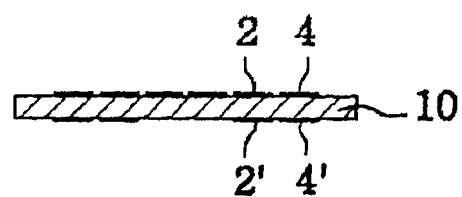

The prepared base board 10 is applied at its both sides with dry films, and subjected to exposing and etching treatments to form driving patterns 2 and 2' and pickup patterns 4 and 4' (FIG. 3b). As shown in FIG. 1, the driving patterns 2 and 2' and the pickup patterns 4 and 4' are comprised of a plurality of parallel pattern lines on the same faces. The pattern lines constituting the driving pattern 2 and the pattern lines constituting the pickup pattern 4 are alternately arranged. The pickup patterns 4 are sized to be longer than the driving patterns 2 so that the pattern lines constituting the driving pattern 2 are completely embedded between the pattern lines constituting the pickup pattern 4. The upper driving and pickup patterns are positioned to be perpendicular to the lower driving and pickup patterns.

Subsequently, the first base board 10 containing the driving and pickup patterns is stacked at its upper and lower surfaces with upper and lower first stacked boards having magnetic layers.

In providing the magnetic layers, the first base board is punched at portions on which the magnetic layers of copper foils are placed. To apply magnetic layers on the first base board 10, a second base layer 21 and a worked copper foil are placed on the first base board 10, and magnetic material is placed on the worked portion of the copper foil. The second base layer 21 is preferably a prepreg which is partially cured, and, for example, is selected from a group consisting of FR-4, FR-4 having high glass transition temperature (Tg), bismaleimide-triazine (BT) epoxy resin, and so on, which are well known in-the art. The magnetic material 1 is selected from a group consisting of amorphous metal, Permalloy and Supermalloy, but the amorphous metal is preferable among the metals. It is preferable that thickness of the copper foil falls in a range of 12–18 $\mu$m, and thickness of the prepreg falls in a range of 60–100 $\mu$m.

According to the present invention, a preliminary lay-up procedure is carried out for the first stacking. The magnetic layer is typically formed into a size equal to that of the second base layer 21 (or prepreg) or a size determined in consideration of a process for manufacturing actual products (for example, magnetic ribbon). An embodiment of a preliminary lay-up using such magnetic ribbons which is intended to make the first stacked board is shown in FIG. 4.

Figure 4:
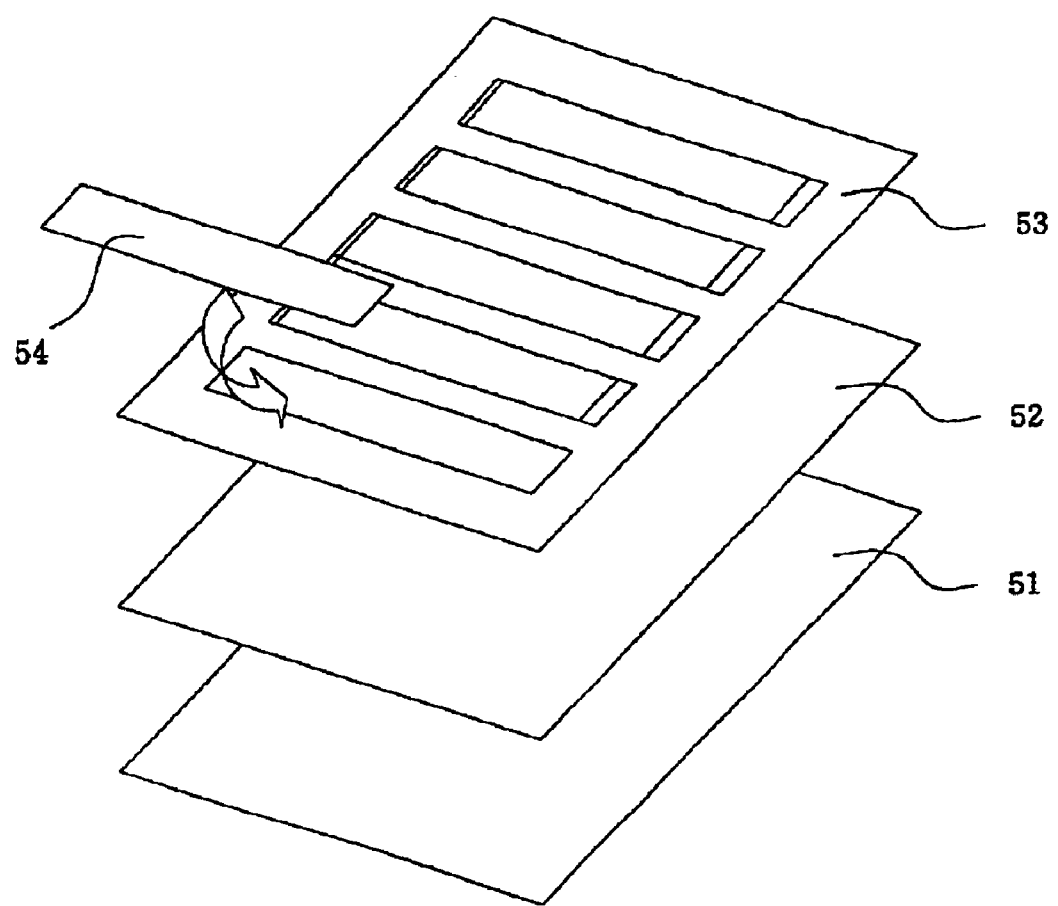
FIG. 4 shows a lay-up process of a first stacked board according to the present invention.

FIG. 4 shows an embodiment of a lay-up to be fabricated into a base layer of work size. An actual finished product is generally formed into a strip including a plurality of printed circuit boards for weak-magnetic field sensor unit. Referring to the drawing, there is shown a lay-up procedure of five magnetic ribbons 54. In this case, a magnetic ribbon 54 is used to fabricate a strip including a plurality of units. Accordingly, a size of the magnetic ribbon is determined depending on size of a strip. However, where being fabricated into a strip, it is necessary to arrange the magnetic ribbons 54 on a prepreg 52 in a subsequent patterning procedure of the magnetic layer such that a plurality of units can be fabricated all at once. Accordingly, in the embodiment, a copper foil 53 on which the magnetic ribbons are to be arranged is positioned to carry out a preliminary lay-up. It is possible to use two methods of fabricating the copper foil. That is, there are a method of removing a portion of desired size by pressing a magnetic plate with a metal mold, and a method of removing a portion of a desired size by a rotating tool using a router process which is one of general processes of fabricating base boards. In this case, a worked object must have a size larger than that of the magnetic ribbons 54. In this connection, it is preferable to work an object to be larger than the magnetic ribbons 54 by about 0.1–0.2 mm in one direction, in consideration of working tolerance and a problem caused by a copper foil covered with magnetic ribbons. Considering an area of a strip occupied by actual products, since the magnetic ribbon 54 has a sufficient size, it is possible to conform the ribbon to a width of the strip. However, since one or more strips may be contained in a magnetic ribbon, a length of the magnetic ribbon is determined in an initial design stage.

Figure 3C:
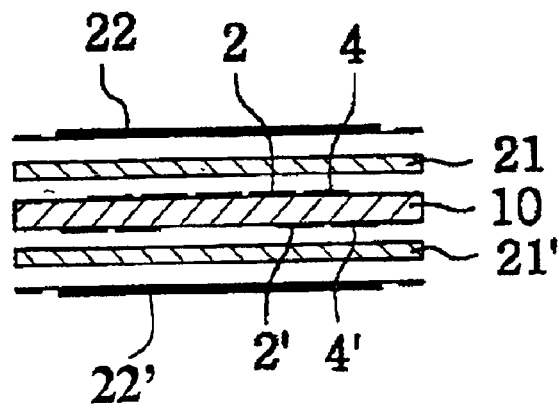

After the first base layer 21 and the magnetic layer 22 are placed on the first base board for the preliminary lay-up, the laminated first base board, the first base layer 21 and the magnetic layer 22 are pressed at high temperature and under high pressure (for example, about 150–200° C. and about 30–40 kg/cm$^2$) to form the first stacked board 20 (FIG. 3c). The lower first stacked board 20' is also manufactured in the same manner as that of the upper first stacked board 20 but a magnetic layer of the lower first stacked board 20' is oriented to be perpendicular to the magnetic layer of the upper first stacked board 20.

Figure 3D:
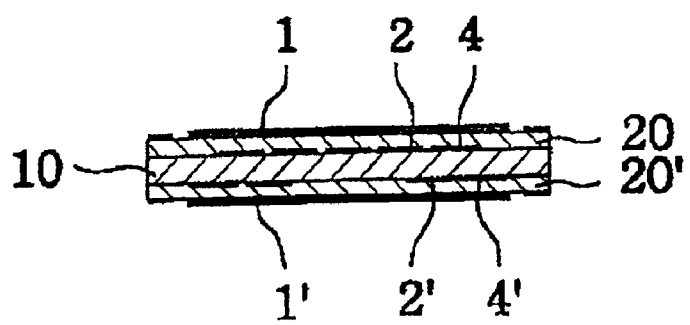
Figure 3E:
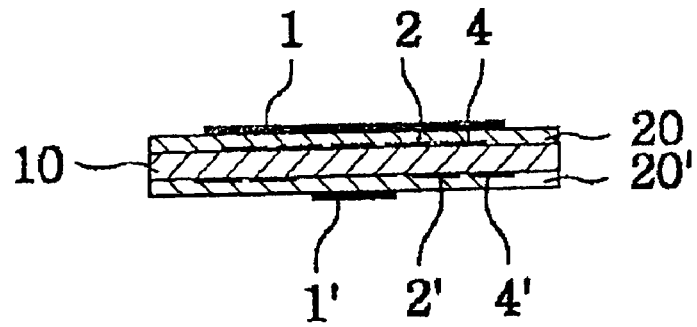

After completion of the first stacking procedure, the first stacked boards 20 and 20' contain the magnetic layers 1 and 1' at outer surfaces thereof. At this point, although preferable thicknesses of the second base layers (prepreg) 21 and 21' and the magnetic layers 22 fall in ranges of about 0.06–0.1 mm and about 0.02–0.03 mm, the thicknesses may be varied depending on desired characteristics of finished products. Subsequently, the first stacked boards 20 and 20' are applied at outer surfaces thereof with dry films (or photoresists), and the dry film layers are subjected to exposure and developing treatments according to patterns of the magnetic layers designed in advance. The magnetic layers 1 and 1' are etched using the dry film layers patterned in certain shapes as masks (FIG. 3d). General principles of the exposure, development and etching techniques are well known in the art. As a result, only the magnetic strips 1 patterned in a certain pattern remain on the first base layers 21 and 21, thereafter, the dry film layers are stripped (FIG. 3e).

Figure 3F:
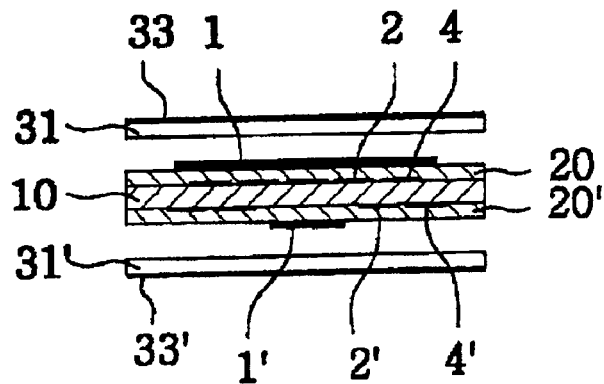

After completion of pattering procedure for the magnetic layers of the first stacked boards 20 and 20', second base layers (or prepregs) 31 and second conductive layers (or copper foils) 33 are temporarily placed on the first stacked boards 20 and 20' (preliminary lay-up), and the laminated layers 32 and 33 are pressed at high temperature and under high pressure (for example, about 150–200° C. and about 30–40 kg/cm$^2$) to form second stacked boards 30 (FIG. 3f).

Figure 3G:
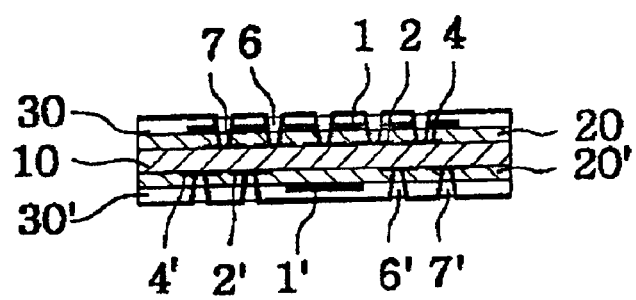

Subsequently, the first stacked board 20 and the second stacked board 30 are formed with first via-holes 6 such that the first driving patterns 2 and the second driving patterns 3 surround the magnetic strips 1, thereby assuming coils wound around the magnetic strips 1. Furthermore, the first stacked board 20 and the second stacked board 30 are formed with second via-holes 7 such that the first pickup patterns 4 and the second pickup patterns 5 are electrically connected to each other. Thereafter, the first via-holes 6 and the second via-holes 7 are plated at inner surfaces thereof with conductive metal (i.e., copper) (FIG. 3g). The lower first stacked board 20' is also stacked with the second stacked board 30', and the first and second stacked boards 20' and 30' are formed with first via-holes 6' and second via-holes 7' in the same manner as that of the upper stacked boards.

Figure 3H:
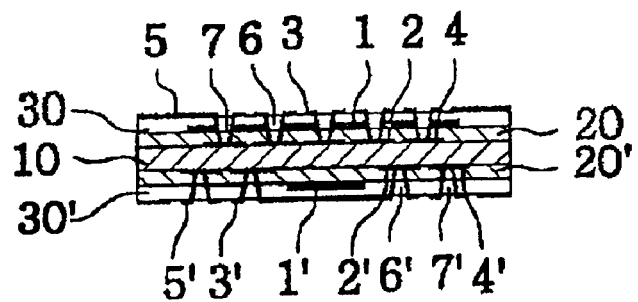

Subsequently, the second stacked boards 30 and 30' are subjected to known manufacturing procedures of printed circuit boards, i.e., exposure, developing and etching techniques, to form second driving patterns 3 ad 3' and second pickup patterns 5 and 5' (FIG. 3h).

The second driving patterns 3 and 3' and the first driving patterns 2 and 2' are electrically connected to each other by the first via-holes 6 and 6' so that the first and second driving patterns surround the magnetic strips 1 and 1', thereby serving as driving coils for the flux gate sensor. Furthermore, the pickup patterns 4 and 5, and 4' and 5' are electrically connected to each other by the second via-holes 7 and 7' to surround the magnetic strips 1 and 1', thereby serving as pickup coils for the flux gate sensor.

Thereafter, to prevent the patterned conductive layers (i.e., copper circuits) exposed to outside from being oxidized by humidity etc., solder mask is selectively applied to all areas excepting the conductive layers, and the conductive layers are formed with nickel (or nickel-phosphor) plated layers and gold plated layers, in this order. Specifics of such procedures are well known in the art of printed circuit boards.

As mentioned previously, the conductive layers used in the stacking procedures of the first and second stacked boards 20 and 30 are preferably made of copper foils. As the copper foils, standardized copper foils of thickness 12 $\mu$m, 18 $\mu$m, 35 $\mu$m and so on may be used. However, where copper foils of thickness 35 $\mu$m are used, it is required to reduce the thickness of the copper foils to at least about 5–7 $\mu$m by a half-etching so as to form circuit patterns after the stacking procedure and before the drilling procedure.

The weak-magnetic field sensors using printed circuit board manufacturing technique according to the present invention can be broadly used in automobiles, aircraft, game machines, and toy robots as well as mobile phones and mobile terminals which are intended to detect the Earth's magnetic field to determine its positional information.

As described above, the present invention provides a weak-magnetic field sensor using printed circuit board manufacturing technique and a method of manufacturing the same, which is manufactured in such a way that circuits are formed on base boards having magnetic strips by etching etc., and driving and pickup patterns are formed thereon so as to detect weak-magnetic fields.

According to the present invention, since circuits are precisely formed on base boards for detecting weak-magnetic fields by etching and so on, it is possible to obtain precise attributes, and it is possible to reduce effects by variance of attributes by maintaining positional accuracy.

In addition, since the present invention can provide a weak-magnetic field sensor, which is miniaturized and consumes little electric power, the sensor can be easily adopted in small-sized electric appliances such as mobile phones.

Furthermore, the weak-magnetic field sensor according to the present invention is capable of detecting weak-magnetic fields with respect to directions of X-axis and Y-axis simultaneously by forming driving patterns and pickup patterns in both directions of X-axis and Y-axis.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A weak-magnetic field sensor using printed circuit board manufacturing technique comprising:
    a first base board which is formed at its upper and lower surfaces with first driving patterns and first pickup patterns;
    a pair of first stacked boards which are stacked on upper and lower surfaces of the first base board and which are formed with magnetic layers thereon; and
    a pair of second stacked boards which are stacked on outer surfaces of the pair of first stacked boards and which are formed with second driving patterns and second pickup patterns electrically connected to the first driving patterns and the first pickup patterns of the first base board to surround magnetic layers;
    the magnetic layer, the driving patterns and the pickup patterns provided on the first base board being oriented to be perpendicular to those provided under the first base board.

2. The weak-magnetic field sensor as set forth in claim 1, in which the first base board is comprised of CCL (Copper Clad Laminate).

3. The weak-magnetic field sensor as set forth in claim 1, in which material of the magnetic layer is selected from a group consisting of amorphous metal, Permalloy and Supermalloy.

4. The weak-magnetic field sensor as set forth in claim 1, in which the upper and lower patterned magnetic layers are formed into band shapes, and the driving patterns and the pickup patterns are oriented to be perpendicular to the magnetic layers.

5. The weak-magnetic field sensor as set forth in claim 1, in which the first and second driving patterns and the first and second pickup patterns are comprised of a plurality of parallel straight patterned lines, and the pickup patterns are sized to be longer than the driving patterns.

6. The weak-magnetic field sensor as set forth in claim 1, in which the first and second stacked boards are formed with first via-holes such that the first and second driving patterns are electrically connected to each other, and the first and second stacked boards are formed with second via-holes such that the first and second-pickup patterns are electrically connected to each other.

7. The weak-magnetic field sensor as set forth in claim 6, in which the patterned lines of the first and second driving patterns are electrically connected to each other in a zigzag manner by the first via-holes to form coils wound around the magnetic layers, and the patterned lines of the first and second pickup patterns are electrically connected to each other in a zigzag manner by the second via-holes to form coils wound around the magnetic layers.

8. A weak-magnetic field sensor using printed circuit board manufacturing technique comprising second driving patterns and pickup patterns (first layer), magnetic strips (second layer) and first driving patterns (third layer) belonging to a X-axis weak-magnetic field sensor unit, and first driving patterns and first pickup patterns (fourth layer), magnetic strips (fifth layer) and second driving patterns and second pickup patterns (sixth layer) from top to bottom in this order,
    wherein the first and second driving patterns are electrically connected to each other to form coils wound around the magnetic strips, and the first and second pickup patterns are electrically connected to each other to form coils wound around the magnetic strips.

9. A method of manufacturing a weak-magnetic field sensor using printed circuit board manufacturing technique, comprising the steps of:
    providing first driving patterns and second pickup patterns of a X-axis direction on a surface of a first base board, and first driving patterns and second pickup patterns of a Y-axis direction on the other surface of the first base board by drilling, plating, exposing, developing and etching procedures;
    preparing first stacked boards on both sides of the first base board by carrying out lay-up of first base layers and magnetic layers on the first base board followed by exposing, developing and etching; and providing second driving patterns and second pickup patterns on both of the upper and lower first stacked boards by carrying out lay-up of second base layers and magnetic layers on both of the upper and lower first stacked boards followed by drilling, plating, exposing, developing and etching.

10. The method as set forth in claim 9, in which the magnetic layers are formed into ribbon shapes; and, prior to the step of preparing the first stacked board, further comprising a step of carrying out a preliminary lay-up to allow the ribbon-shaped magnetic layers to be stacked at predetermined positions of the first base layers.

11. The method as set forth in claim 9, in which the first base layers and the second base layers are comprised of prepregs.

12. The method as set forth in claim 11, in which the prepreg is selected from a group consisting of FR-4, FR-4 having high glass transition temperature (Tg) and bismaleimide-triazine (BT) epoxy resin.

13. The method as set forth in claim 9, in which the first and second stacked boards are formed with first via-holes by the drilling such that the first driving patterns and the second driving patterns are electrically connected to each other, and the first and second stacked boards are formed with second via-holes by the drilling such that the first pickup patterns and the second pickup patterns are electrically connected to each other.

14. The method as set forth in claim 13, in which the patterned lines of the first and second driving patterns are electrically connected to each other in a zigzag manner by the first via-holes to form coils wound around the magnetic layers, and the patterned lines of the first and second pickup patterns are electrically connected to each other in a zigzag manner by the second via-holes to form coils wound around the magnetic layers.

* * * * *